(12) United States Patent
Hsu et al.

(10) Patent No.: US 12,346,023 B2
(45) Date of Patent: Jul. 1, 2025

(54) OPTICAL ASSEMBLY WITH COATING AND METHODS OF USE

(71) Applicant: Taiwan Semiconductor Manufacturing Co., Ltd., Hsinchu (TW)

(72) Inventors: Pei-Cheng Hsu, Hsinchu (TW); Ping-Hsun Lin, Hsinchu (TW); Ta-Cheng Lien, Hsinchu (TW); Hsin-Chang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/365,760

(22) Filed: Aug. 4, 2023

(65) Prior Publication Data

US 2023/0408906 A1  Dec. 21, 2023

Related U.S. Application Data

(62) Division of application No. 17/481,010, filed on Sep. 21, 2021.

(60) Provisional application No. 63/149,108, filed on Feb. 12, 2021.

(51) Int. Cl.
*G03F 1/62* (2012.01)
*C23C 16/455* (2006.01)
*G03F 7/00* (2006.01)

(52) U.S. Cl.
CPC .......... *G03F 1/62* (2013.01); *C23C 16/45525* (2013.01); *G03F 7/70033* (2013.01); *G03F 7/70983* (2013.01)

(58) Field of Classification Search
CPC .... G03F 1/62; G03F 7/70033; G03F 7/70983; C23C 16/45525
See application file for complete search history.

(56) References Cited

U.S. PATENT DOCUMENTS

| 8,049,327 B2 | 11/2011 | Kuo et al. |
| 9,897,930 B2 | 2/2018 | Sjmaenok et al. |
| 10,534,256 B2 | 1/2020 | Chen et al. |

(Continued)

FOREIGN PATENT DOCUMENTS

| CN | 108878259 A | 11/2018 |
| JP | 2018194838 A | 12/2018 |

(Continued)

*Primary Examiner* — Sean M DeGuire
*Assistant Examiner* — Jayson D Cosgrove
(74) *Attorney, Agent, or Firm* — Seed IP Law Group LLP

(57) ABSTRACT

Coated nanotubes and bundles of nanotubes are formed into membranes useful in optical assemblies in EUV photolithography systems. These optical assemblies are useful in methods for patterning materials on a semiconductor substrate. Such methods involve generating, in a UV lithography system, UV radiation. The UV radiation is passed through a coating layer of the optical assembly, e.g., a pellicle assembly. The UV radiation that has passed through the coating layer is passed through a matrix of individual nanotubes or matrix of nanotube bundles. UV radiation that passes through the matrix of individual nanotubes or matrix of nanotube bundles is reflected from a mask and received at a semiconductor substrate.

20 Claims, 17 Drawing Sheets

(56) References Cited

U.S. PATENT DOCUMENTS

| | | | |
|---|---|---|---|
| 2009/0081594 A1* | 3/2009 | Chen | B82Y 30/00 |
| | | | 977/773 |
| 2010/0005553 A1 | 1/2010 | Jin et al. | |
| 2018/0329289 A1* | 11/2018 | Gallagher | G03F 1/62 |
| 2018/0329291 A1 | 11/2018 | Timmermans et al. | |
| 2020/0272047 A1 | 8/2020 | Chatterjee et al. | |
| 2020/0355995 A1 | 11/2020 | Kim et al. | |
| 2021/0191255 A1* | 6/2021 | Timmermans | G03F 7/70983 |
| 2022/0140307 A1* | 5/2022 | Darolles | H01M 4/366 |
| | | | 429/209 |
| 2022/0276553 A1* | 9/2022 | Nikipelov | C01B 32/168 |

FOREIGN PATENT DOCUMENTS

| | | |
|---|---|---|
| KR | 20190003752 A | 1/2019 |
| TW | 201723644 A | 7/2017 |

\* cited by examiner

OPTICAL ASSEMBLY WITH COATING AND METHODS OF USE

BACKGROUND

The present disclosure relates to the field of ultraviolet and extreme ultraviolet lithography and to optical assemblies used in ultraviolet and extreme ultraviolet lithography.

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

A photolithography process forms a patterned resist layer for various patterning processes, such as etching or ion implantation. The minimum feature size that may be patterned by way of such a lithography process is limited by the wavelength of the projected radiation source. Lithography machines have gone from using ultraviolet light with a wavelength of 365 nanometers to using deep ultraviolet (DUV) light including a krypton fluoride laser (KrF laser) of 248 nanometers and an argon fluoride laser (ArF laser) of 193 nanometers, and to using extreme ultraviolet (EUV) light of a wavelength of 13.5 nanometers, improving the resolution at every step.

In the photolithography process, a photomask (or mask) is used. The mask includes a substrate and a patterned layer that defines an integrated circuit to be transferred to a semiconductor substrate during the photolithography process. The mask is typically included with a pellicle assembly, collectively referred to as a mask system. The pellicle assembly includes a transparent thin membrane and a pellicle frame, where the membrane is mounted over the pellicle frame. The pellicle protects the mask from fallen particles and keeps the particles out of focus so that they do not produce a patterned image, which may cause defects in the patterned semiconductor substrate when the mask is being used. The membrane is typically stretched and mounted over the pellicle frame, and is attached to the pellicle frame by glue or other adhesives. An internal space may be formed by the mask, the membrane, and the pellicle frame.

DETAILED DESCRIPTION

Figure 1:
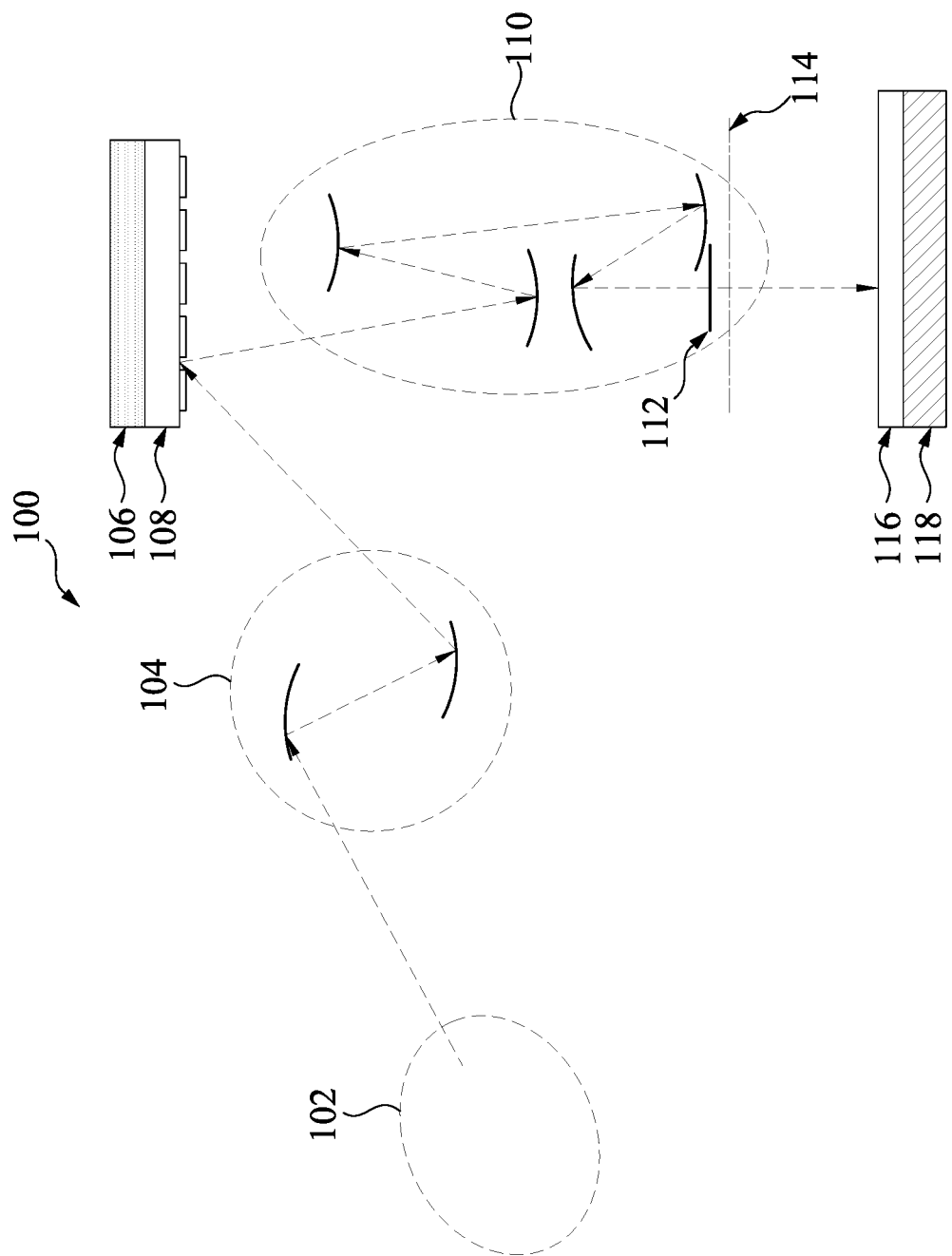
FIG. 1 is a schematic view of a lithography system in accordance with some embodiments of the present disclosure.

In the following description, thicknesses and materials may be described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

"Vertical direction" and "horizontal direction" are to be understood as indicating relative directions. Thus, the horizontal direction is to be understood as substantially perpendicular to the vertical direction and vice versa. Nevertheless, it is within the scope of the present disclosure that the described embodiments and aspects may be rotated in its entirety such that the dimension referred to as the vertical direction is oriented horizontally and, at the same time, the dimension referred to as the horizontal direction is oriented vertically.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments in accordance with the present disclosure provide optical assemblies suitable for transmitting UV or EUV radiation and protecting UV or EUV reflecting components of a lithography system. The optical assemblies exhibit desirable UV/EUV transmission levels and promote heat transfer from the optical assembly. The optical assemblies are also resistant to damage from exposure to gases such as hydrogen, oxygen and H$^+$ gas.

The various advantages and purposes of embodiments in accordance with the present disclosure as described above and hereafter are achieved by providing, according to aspects of the present disclosure an optical assembly that includes the matrix of a plurality of nanotube bundles or a matrix of individual nanotubes. In accordance with some embodiments, the individual nanotubes are coated with a coating layer to protect the nanotubes. In other embodiments, the nanotube bundles are coated with the coating layer; however, the individual nanotubes of the nanotube bundles are not individually coated with a coating layer. In other embodiments the individual nanotubes of the nanotube bundles are coated with a coating layer and the nanotube bundle is formed from such coated individual nanotubes. These optical assemblies are useful in methods for patterning materials on a semiconductor substrate. Such methods involve generating, in a UV lithography system, UV radiation. The UV radiation is passed through a coating layer of an optical assembly, e.g., a pellicle assembly. The UV radiation that has passed through the coating layer is passed through a matrix of individual nanotubes or matrix of nanotube bundles. UV radiation that passes through the matrix of individual nanotubes or matrix of nanotube bundles is reflected from a mask and received at a semiconductor substrate. In accordance with other embodiments, the coating layer is applied to a transparent layer of a pellicle assembly.

Illustrated in FIG. 1 is a schematic view of a lithography system 100, in accordance with some embodiments. The lithography system 100 may also be generically referred to as a scanner that is operable to perform lithographic processes including exposure with a respective radiation source and in a particular exposure mode. In at least some of the present embodiments, the lithography system 100 includes an ultraviolet (UV) lithography system designed to expose a resist layer with UV radiation, i.e., UV light. Inasmuch, in various embodiments, the resist layer includes a material sensitive to the UV light (e.g., a UV resist). The lithography system 100 of FIG. 1 includes a plurality of subsystems such as a radiation source 102, an illuminator 104, a mask stage 106 configured to receive a mask 108, projection optics 110, and a substrate stage 118 configured to receive a semiconductor substrate 116. The following description of a UV photolithography system in accordance with embodiments of the present disclosure refers to extreme ultraviolet radiation as an example of ultraviolet radiation. Embodiments in accordance with the present disclosure are not limited to extreme ultraviolet radiation lithography systems. In other words, embodiments described with reference to extreme ultraviolet lithography systems include embodiments that utilize ultraviolet radiation. A general description of the operation of the lithography system 100 is as follows: EUV light from the radiation source 102 is directed toward the illuminator 104 (which includes a set of reflective mirrors) and projected is onto the reflective mask 108. A reflected mask image is directed toward the projection optics 110, which focuses the EUV light and projects the EUV light onto the semiconductor substrate 116 to expose a EUV resist layer deposited thereupon. Additionally, in various examples, each subsystem of the lithography system 100 may be housed in, and thus operate within, a high-vacuum environment, for example, to reduce atmospheric absorption of the EUV light.

In the embodiments described herein, the radiation source 102 may be used to generate the EUV light. In some embodiments, the radiation source 102 includes a plasma source, such as for example, a discharge produced plasma (DPP) or a laser produced plasma (LPP). In some examples, the EUV light may include light having a wavelength ranging from about 1 nm to about 100 nm. In one particular example, the radiation source 102 generates EUV light with a wavelength centered at about 13.5 nm. Accordingly, the radiation source 102 may also be referred to as a EUV radiation source 102. In some embodiments, the radiation source 102 also includes a collector, which may be used to collect EUV light generated from the plasma source and to direct the collected EUV light toward imaging optics such as the illuminator 104.

As described above, EUV light from the radiation source 102 is directed toward the illuminator 104. In some embodiments, the illuminator 104 may include reflective optics (e.g., for the EUV lithography system 100), such as a single mirror or a mirror system having multiple mirrors in order to direct light from the radiation source 102 onto the mask stage 106, and particularly to the mask 108 secured on the mask stage 106. In some examples, the illuminator 104 may include a zone plate (not shown), for example, to improve focus of the EUV light. In some embodiments, the illuminator 104 may be configured to shape the EUV light passing there through in accordance with a particular pupil shape, and including for example, a dipole shape, a quadrapole shape, an annular shape, a single beam shape, a multiple beam shape, and/or a combination thereof. In some embodiments, the illuminator 104 is operable to configure the mirrors (i.e., of the illuminator 104) to provide a desired illumination to the mask 108. In one example, the mirrors of the illuminator 104 are configurable to reflect EUV light to different illumination positions. In some embodiments, a stage (not shown) prior to the illuminator 104 may additionally include other configurable mirrors that may be used to direct the EUV light to different illumination positions within the mirrors of the illuminator 104. In some embodiments, the illuminator 104 is configured to provide an on-axis illumination (ONI) to the mask 108. In some embodiments, the illuminator 104 is configured to provide an off-axis illumination (OAI) to the mask 108. It should be noted that the optics employed in the EUV lithography system 100, and in particular optics used for the illuminator 104 and the projection optics 110, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the lithography system 100 also includes the mask stage 106 configured to secure the mask 108 within the lithography system. Since the lithography system 100 may be housed in, and thus operate within, a high-vacuum environment, the mask stage 106 may include an electrostatic chuck (e-chuck) to secure the mask 108. As with the optics of the EUV lithography system 100, the mask 108 is also reflective. Details of the mask 108 are discussed in more detail below with reference to the example of FIG. 2. As illustrated in FIG. 1, light is reflected from the mask 108 and directed towards the projection optics 110, which collects the EUV light reflected from the mask 108. By way of example, the EUV light collected by the projection optics 110 (reflected from the mask 108) carries an image of the pattern defined by the mask 108. In various embodiments, the projection optics 110 provides for imaging the pattern of the mask 108 onto the semiconductor substrate 116 secured on the substrate stage 118 of the lithography system 100. In particular, in various embodiments, the projection optics 110 focuses the collected EUV light and projects the EUV light onto the semiconductor substrate 116 to expose a EUV resist layer deposited on the semiconductor substrate 116. As described above, the projection optics 110 may include reflective optics, as used in EUV lithography systems such as the lithography system 100. In some embodiments, the illuminator 104 and the projection optics 110 are collectively referred to as an optical module of the lithography system 100.

As discussed above, the lithography system 100 also includes the substrate stage 118 to secure the semiconductor substrate 116 to be patterned. In various embodiments, the semiconductor substrate 116 includes a semiconductor wafer, such as a silicon wafer, germanium wafer, silicon-germanium wafer, III-V wafer, or other type of wafer. The semiconductor substrate 116 may be coated with a resist layer (e.g., an EUV resist layer) sensitive to EUV light. EUV resists may have stringent performance standards. For purposes of illustration, an EUV resist may be designed to provide at least around 22 nm resolution, at least around 2 nm line-width roughness (LWR), and with a sensitivity of at least around 15 mJ/cm2. In the embodiments described herein, the various subsystems of the lithography system 100, including those described above, are integrated and are operable to perform lithography exposing processes including EUV lithography processes. To be sure, the lithography system 100 may further include other modules or subsystems which may be integrated with (or be coupled to) one or more of the subsystems or components described herein.

The lithography system may include other components and may have other alternatives. In some embodiments, the lithography system 100 may include a pupil phase modulator 112 to modulate an optical phase of the EUV light directed from the mask 108, such that the light has a phase distribution along a projection pupil plane 114. In some embodiments, the pupil phase modulator 112 includes a mechanism to tune the reflective mirrors of the projection optics 110 for phase modulation. For example, in some embodiments, the mirrors of the projection optics 110 are configurable to reflect the EUV light through the pupil phase modulator 112, thereby modulating the phase of the light through the projection optics 110. In some embodiments, the pupil phase modulator 112 utilizes a pupil filter placed on the projection pupil plane 114. By way of example, the pupil filter may be employed to filter out specific spatial frequency components of the EUV light reflected from the mask 108. In some embodiments, the pupil filter may serve as a phase pupil filter that modulates the phase distribution of the light directed through the projection optics 110.

Figure 2:
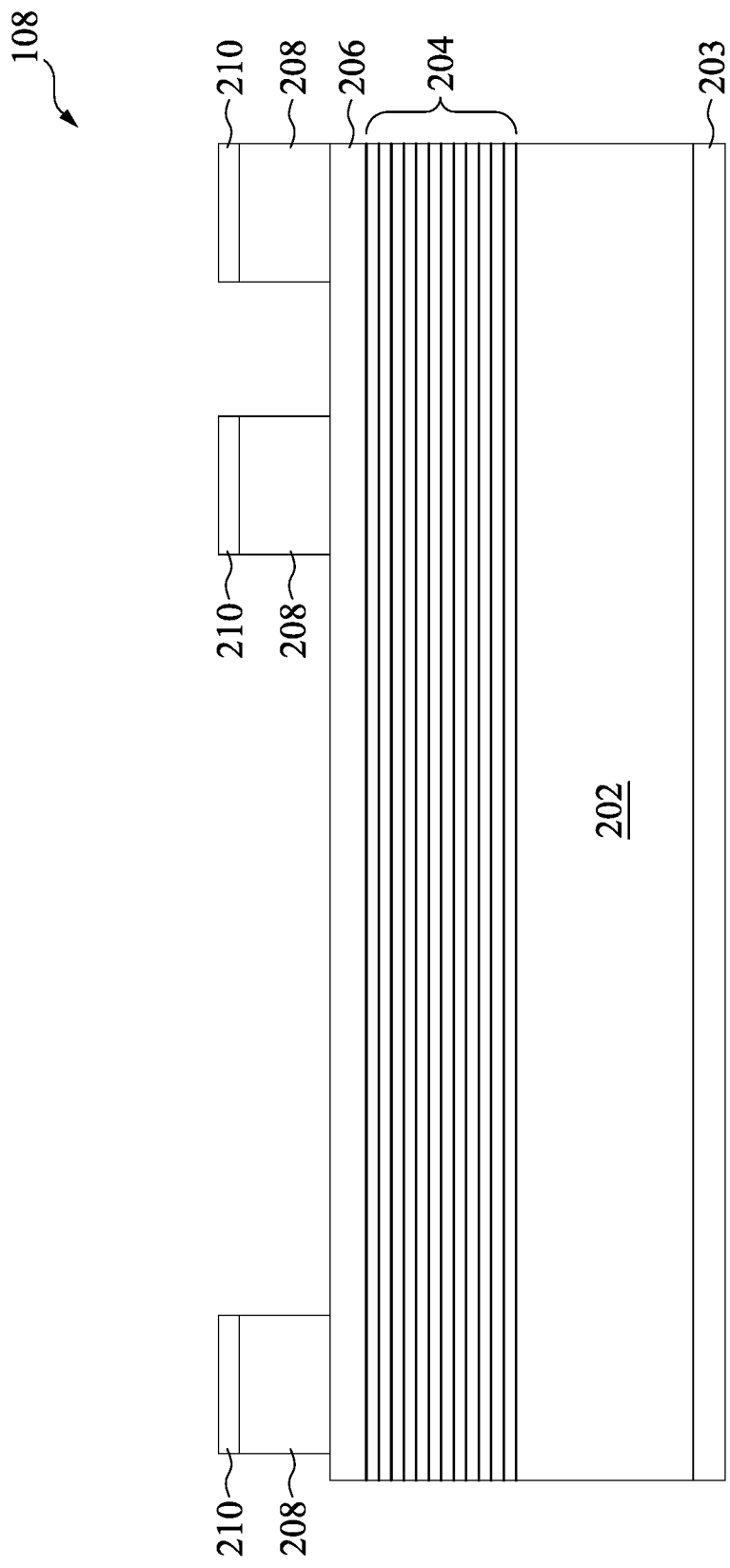
FIG. 2 is a schematic cross-sectional view of a mask for use in embodiments of the present disclosure.

Referring to FIG. 2, the mask 108 includes a patterned image comprising one or more absorbers 208 having an anti-reflective coating (ARC) layer 210. The one or more absorbers 208 and anti-reflective coating are on a multi-layer structure 204, e.g., Mo—Si multi-layers, which is on a substrate 202. Examples of the materials for the absorbers 208 include a tantalum nitride layer or a $Ta_xB_yO_zN_u$. Examples of materials for the antireflective coating layer include $Ta_xB_yO_zN_u$, an $Hf_xO_y$ layer or a $Si_xO_yN_z$ layer. An example of a substrate 202 includes a low thermal expansion material substrate, such as $TiO_2$ doped $SiO_2$. In the illustrated embodiment of FIG. 2, the multi-layer structure 204 is covered by a capping layer 206 and the backside of substrate 202 is covered with a backside coating layer 203. An example of a material for capping layer 206 includes ruthenium. An example of a material for backside coating layer 203 includes chromium nitride.

As discussed above, the mask 108 is used to transfer circuit and/or device patterns onto a semiconductor wafer (e.g., the semiconductor substrate 116) by the lithography system 100. To achieve a high fidelity pattern transfer from the patterned mask 108 to the semiconductor substrate 116, the lithography process should be defect free. Unwanted particles, e.g., particles of Sn that are used to generate the EUV light in the radiation source 102 may be unintentionally deposited on the surface of the capping layer 206 and can result in degradation of lithographically transferred patterns if not removed. Particles may be introduced by any of a variety of methods besides as part of the EUV light generation, such as during an etching process, a cleaning process, and/or during handling of the EUV mask 108.

Accordingly, the mask 108 is integrated with a pellicle and is protected by the pellicle assembly. The mask and the pellicle assembly are collectively referred to as a mask-pellicle system. For example, during the lithography patterning process by the lithography system 100, the mask-pellicle system is secured to the mask stage 106.

Figure 3A:
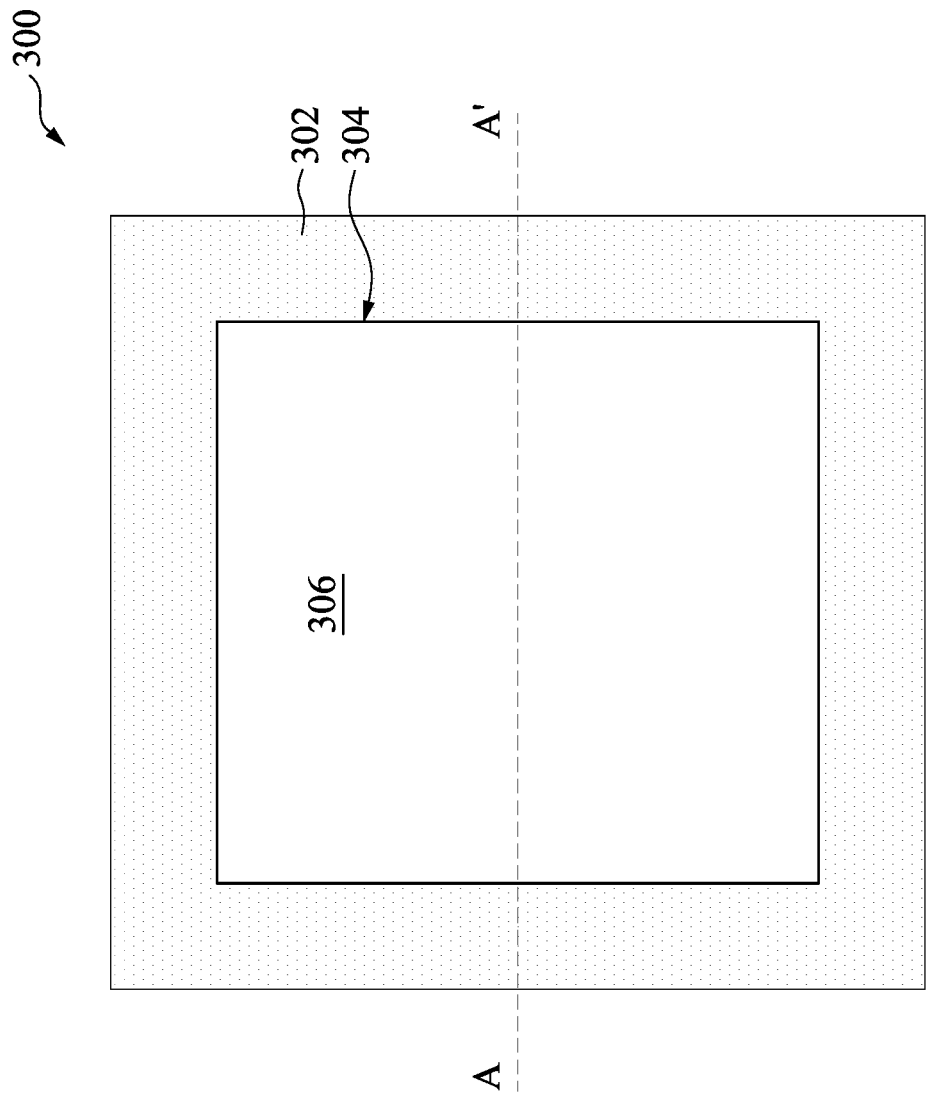
FIGS. 3A-3C are a top view, a perspective view, and a cross-sectional view along line A-A', respectively, of a mask pellicle system in accordance with some embodiments of the present disclosure.
Figure 3B:
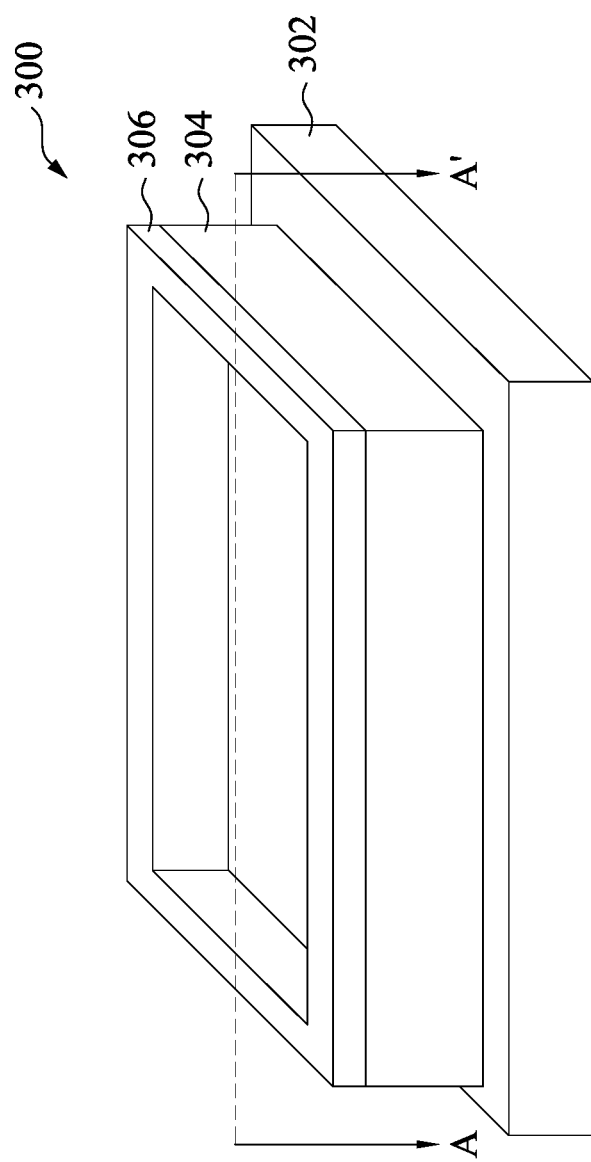
Figure 3C:
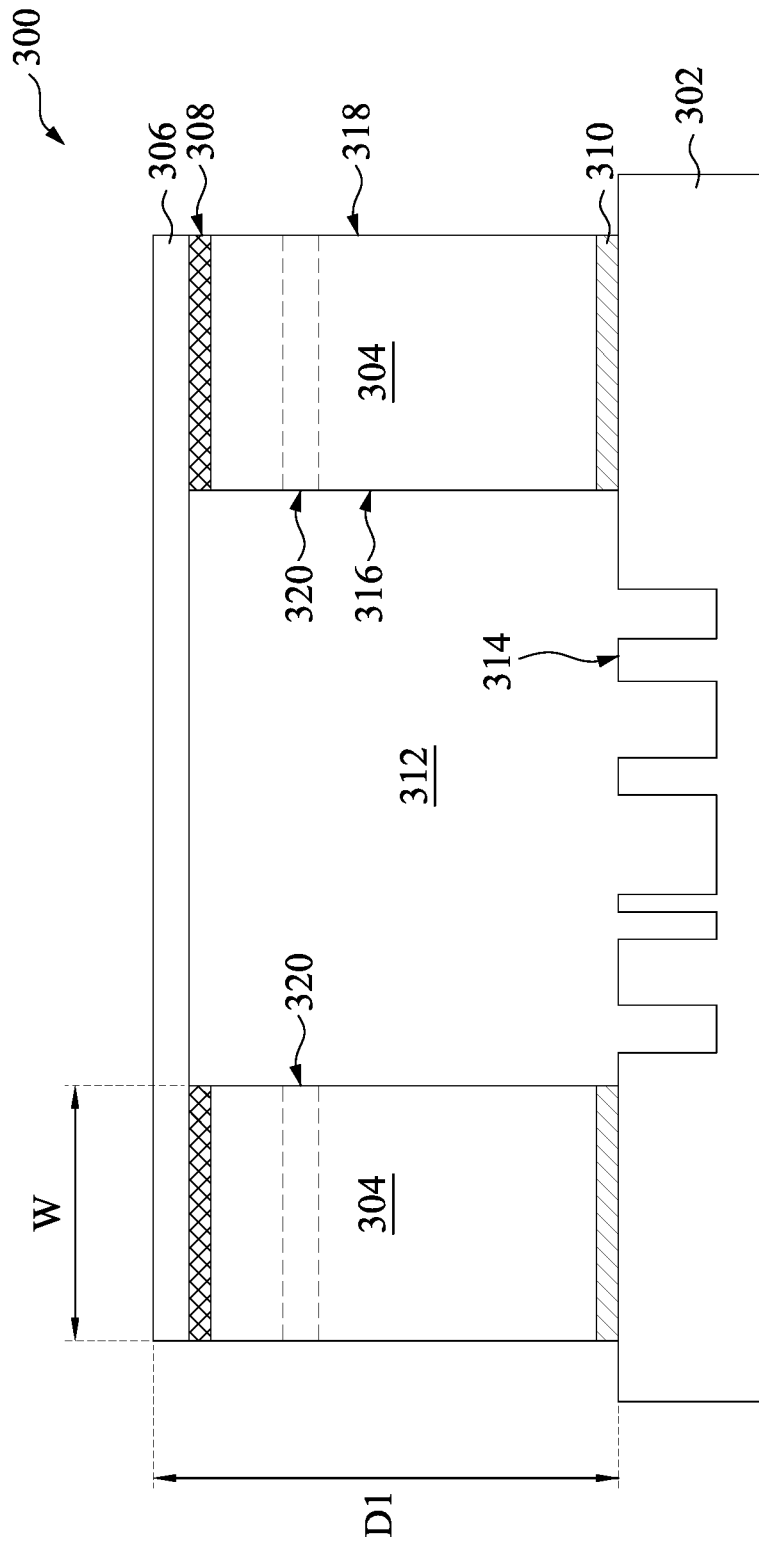

With reference to FIGS. 3A, 3B, and 3C, illustrated therein is a top-view, a perspective view, and a cross-sectional view along line A-A', respectively, of a mask pellicle system 300. Referring to FIGS. 3A, 3B, and 3C, the mask pellicle system 300 and a method of using the same are described. While embodiments of the present disclosure are described with reference to a mask of a photolithography system, it is understood that the embodiments of the present disclosure are useful with other UV or EUV reflecting components of a lithography system that reflect UV or EUV radiation.

The mask pellicle system 300 includes a mask 302, a pellicle frame 304 and an optical assembly, e.g., membrane (or pellicle membrane) 306 integrated together through adhesive material layers 308 and 310. As discussed above, the mask 302 also includes a patterned surface 314 used to pattern a semiconductor substrate by a lithographic process. In some embodiments, the mask 302 may be substantially the same as the mask 108, discussed above. In the present embodiment, the mask 302 is integrated in the mask pellicle system 300 and is secured on the mask stage 106 collectively with the membrane 306 and the pellicle frame 304 during a lithography patterning process.

The membrane 306 is configured proximate to the mask 302 and is attached to the pellicle frame 304 through the adhesive layer 308. Particularly, the membrane 306 is attached to the pellicle frame 304 through the adhesive material layer 308. The mask 302 is further attached to the pellicle frame 304 through the adhesive material layer 310. Thus, the mask 302, the pellicle frame 304 and the membrane 306 are thus configured and integrated to enclose an internal space 312. The patterned surface 314 of the mask 302 is enclosed in the internal space 312 and is therefore protected from contamination during a lithography patterning process, mask shipping, and mask handling. In the illustrated embodiment of FIG. 3C, pellicle frame 304 is provided with two vent holes 320. Embodiments in accordance with the present disclosure can include only a single vent hole 320 or include more than two vent holes 320. Vent holes serve to equalize air pressure between the open space bounded by the pellicle frame 304 and the pellicle membrane 306 and the environment outside the pellicle frame 304 and pellicle membrane 306. Vent holes 320 can be provided with filters (not shown) configured to prevent particles from entering vent holes 320. As shown in FIG. 3C, stacked layers of the adhesive material layer 310, the pellicle frame 304, the adhesive material layer 308, and the membrane 306 has a height D1, and the pellicle frame 304 has a width W.

The membrane 306 is made of a thin film transparent to the radiation beam used in a lithography patterning process, and furthermore has a thermal conductive surface. The membrane 306 is also configured proximate to the patterned surface 314 on the mask 302 as illustrated in FIG. 3C. In various embodiments, the membrane 306 includes a transparent material layer with a thermal conductive film on one surface (or both surfaces).

FIG. 4 is a cross-sectional view of the membrane 306, constructed in accordance with some embodiments. The membrane 306 includes a transparent layer 402 or core material layer of one or more materials including silicon, such as polycrystalline silicon (poly-Si), amorphous silicon (a-Si), doped silicon (such as phosphorous doped silicon SiP or SiC) or a silicon-based compound, such as SiN or $MoSi_xN_y$, or combination (SiN/MoSiN). Alternatively, the transparent layer 402 includes polymer, graphene, carbon network membrane, carbon nanotubes, silicon carbon nanotube, boron nitride nanotube, carbon nanotube bundles or other suitable material, including bundles of nanotubes. In some embodiments, the membrane 306 is characterized by the absence of oxygen containing materials, e.g., $SiO_2$. Membranes 306 without oxygen containing materials are less susceptible to degradation caused by $H^+$ radicals that membranes 306 are exposed to during the photolithography process or during maintenance of the photolithography system. When a membrane 306 containing oxygen containing materials, such as $SiO_2$ is exposed to $H^+$ radicals, peeling of coatings provided on the $SiO_2$ has been observed. The transparent layer 402 has a thickness with enough mechanical strength, but in some embodiments, not a thickness that degrades the transparency of the membrane to extreme ultraviolet radiation from the radiation source by more than 15% in some embodiments, more than 10% in some embodiments or more than 5% in some embodiments. In some examples, the transparent layer 402 has a thickness ranging between 30 nm and 50 nm.

Figure 4A:
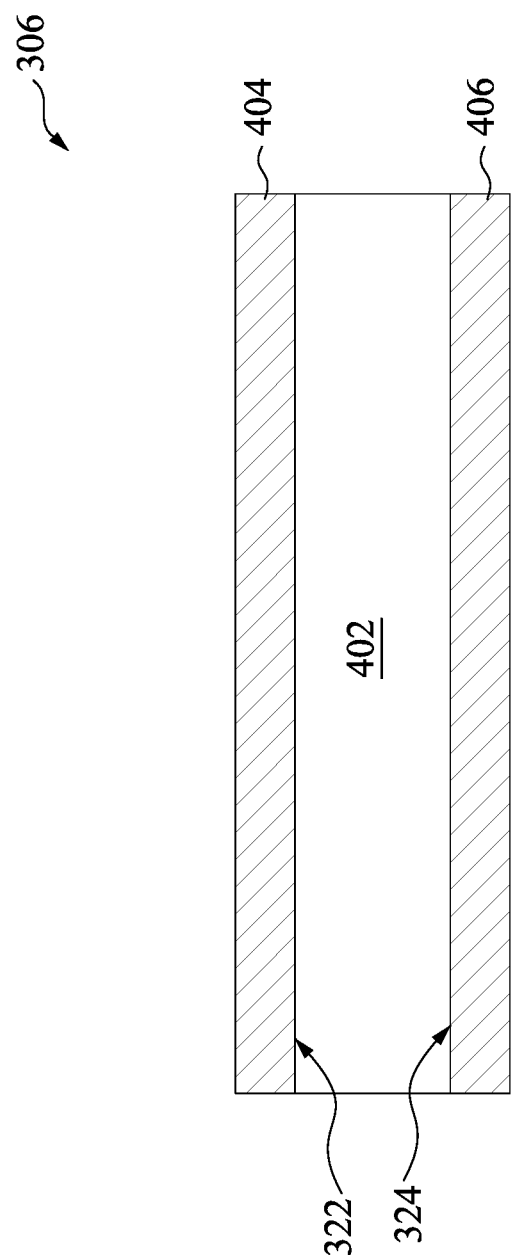
FIGS. 4A-4D are schematic cross-sectional views of several pellicle membranes in accordance with embodiments described herein.
Figure 4B:
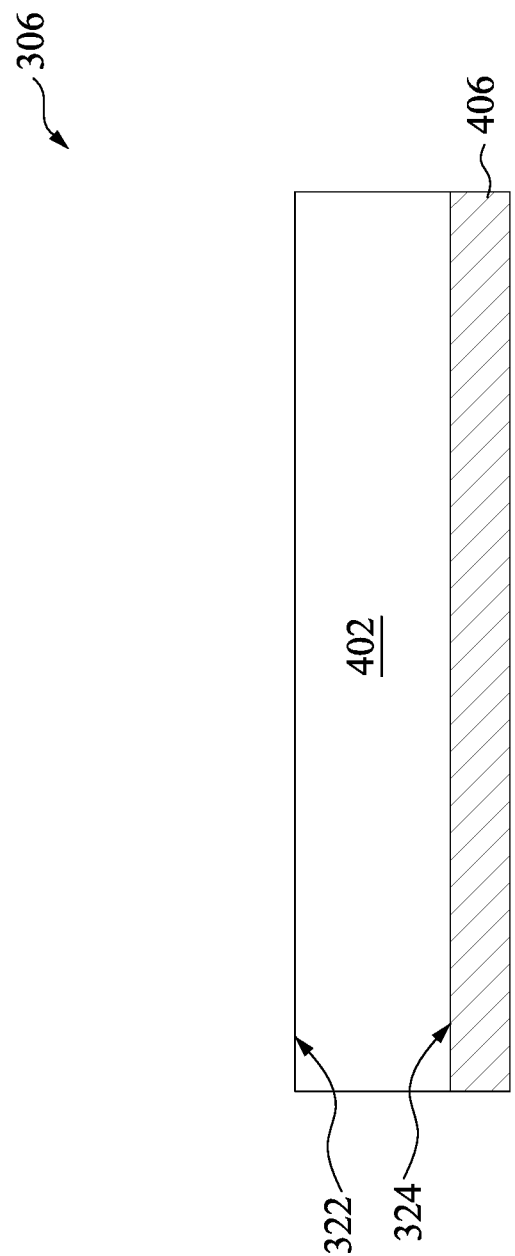
Figure 4C:
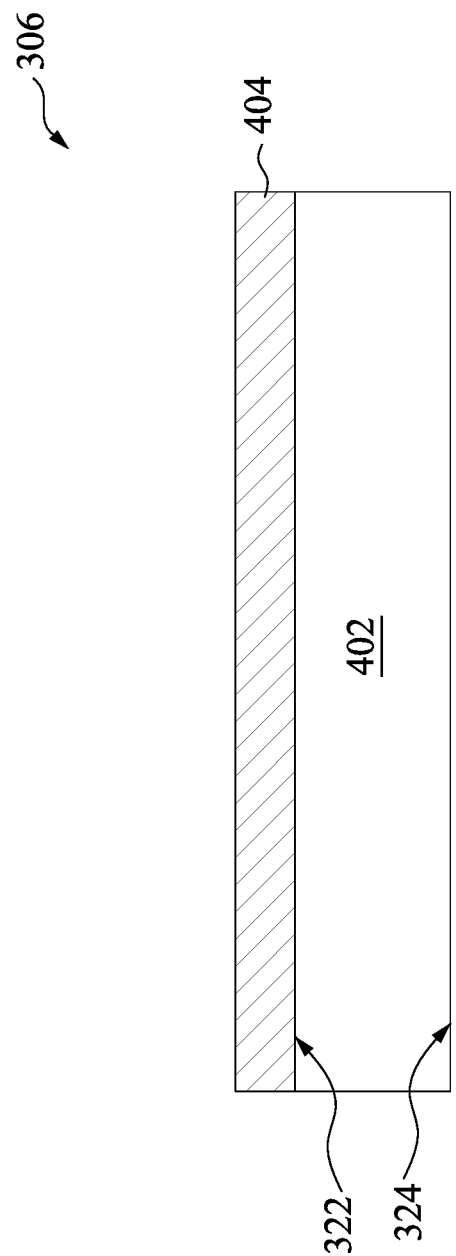
Figure 4D:
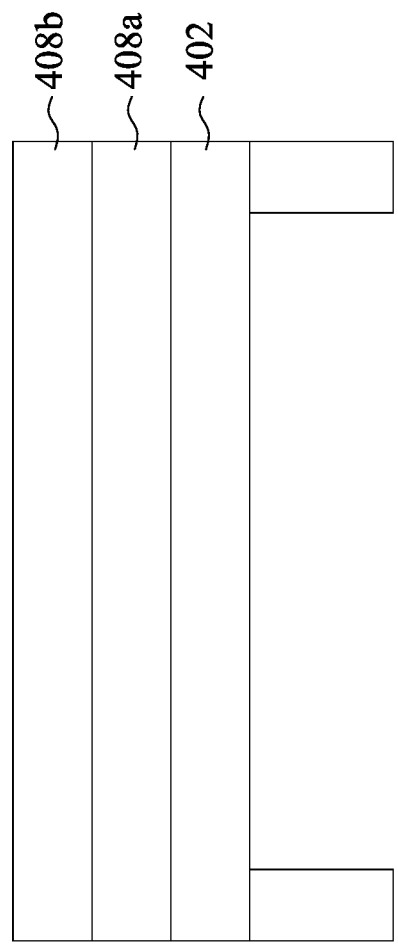

In some embodiments, the membrane 306 includes a first coating layer 404 formed on the external surface 322 of the transparent layer 402 and a second coating layer 406 formed on the internal surface 324 of the transparent layer 402. In FIG. 4A, the external surface 322 of the transparent layer 402 is its top surface and the internal surface 324 of the transparent layer 402 is its bottom surface. In accordance with the embodiment illustrated in FIG. 4A, the material of the coating layer 404 is the same as the material of the coating layer 406. In other embodiments in accordance with FIG. 4A, the material of the coating layer 404 is different from the material of the coating layer 406. In yet other embodiments in accordance with FIG. 4A, coating layer 404 comprises multiple layers of material. Similarly, in other embodiments, coating layer 406 comprises multiple layers of material. Such multiple layers can include the same material or different materials. In addition, the multiple layers of material making up coating layer 404 and/or coating layer 406 can be the same thickness or can be different thicknesses. In FIG. 4B, the coating layer 406 is provided only on the internal surface 324 and not the external surface 322. In other embodiments in accordance with FIG. 4B, coating layer 406 comprises multiple layers of material. In addition, the multiple layers of material making up coating layer 406 in FIG. 4B can be the same thickness or can be different thicknesses. In FIG. 4C, the coating layer 404 is provided only on the external surface 322 and not the internal surface 324. In other embodiments in accordance with FIG. 4C, coating layer 404 comprises multiple layers of material. In addition, the multiple layers of material making up coating layer 404 in FIG. 4B can be the same thickness or can be different thicknesses. The coating layer (404 or 406) protects the transparent layer 402 from attack, such as by chemicals and/or particles. In some embodiments, the coating layer 404 and 406 promotes heat transfer from the transparent layer 402. In accordance with another embodiment of the present disclosure, FIG. 4D illustrates an example where a first coating layer 408a is on transparent layer 402 and a second coating layer 408b is on first coating layer 408a. In accordance with the embodiment of FIG. 4D, the material of the first coating layer 408a and the material of the second coating layer 408b may be the same or they may be different. (for example: 408a: MoSiN and 408b: SiN2)

In accordance with some embodiments of the present disclosure, choice of a particular material for use as first coating layer 404 and/or second coating layer 406 should take into consideration a number of different factors, including how thick a layer of material is needed to provide a conformal coating, the scattering effect of the material on UV or EUV, transmission of the UV or EUV and reflection of the UV or EUV, absorption of the UV or EUV, resistance to desorption of oxygen and attack by ionized gases that come in contact with the coating layers, e.g., $H^+$ gas.

For example, materials which are susceptible to being applied as a thinner coat while providing a conformal coating are preferred over materials that require application of a thicker coat to provide a conformal coating. In some embodiments, coating layers 404 or 406 have a thickness on the order of 1 to 10 nanometers.

Materials which scatter less of the EUV radiation directed at the mask are preferred over materials that scatter more of the same EUV radiation. Examples of such materials include boron nitride (BN) and silicon nitride ($Si_3N_4$). Ruthenium is not a suitable material for coating layers in accordance with embodiments of the present disclosure because ruthenium exhibits a differential scattering cross-section of EUV radiation at zero degrees and 360 degrees that is about 6 times greater than the differential scattering cross-section of EUV radiation at zero degrees and 360 degrees for a transparent material coated with boron nitride or silicon nitride. Generally, a material with a lower index of refraction produces more scattering compared to a material with a higher index of refraction. Thus, when selecting a material for coating layers 404 and 406 based only on its index of refraction, a material having a higher index of refraction would be preferred over a material having a lower index of refraction.

Generally, a material with a higher extinction coefficient k, indicating a higher absorption of radiation, is less desirable than a material exhibiting a lower extinction coefficient k because the material with a higher extinction coefficient will transmit less UV or EUV. Thus, when selecting a material for coating layers 404 and 406 based only on its extinction coefficient k, a material having a lower extinction coefficient would be preferred over a material having a higher extinction coefficient.

Materials which transmit more of the UV or EUV radiation directed at the mask are preferred over materials that transmit less of the same UV or EUV radiation. For example, in some embodiments, materials that transmit 80% or more of the radiation directed at the mask are suitable. In other embodiments, materials that transmit 85% or more of the radiation directed at the mask are suitable. In yet other embodiments, materials that transmit 90% or more of the radiation directed at the mask are suitable. In other embodiments, materials that transmit 95% or more of the radiation directed at the mask are suitable.

Materials that reflect less of the radiation to be directed at the mask are preferred over materials that reflect more of the same EUV radiation.

Materials that absorb less of the EUV radiation to be directed at the mask are preferred over materials that absorb more of the same EUV radiation.

Materials that are more resistant to desorption of oxygen are preferred over materials that are less resistant to desorption of oxygen.

Materials that include higher valence oxides are less suitable as materials for coating layer 404 or 406 because they are susceptible to radiation stimulated desorption of oxygen initiated by creation of holes in shallow core levels. These resulting holes cause the coating layer to be more reactive with gas molecules the coating layer is exposed to during the photolithography process or maintenance processes as compared to the reactivity of a coating layer that does not include higher valence oxides. In accordance with embodiments of the present disclosure, materials that do not include higher valence oxides are preferred over materials that include higher valence oxides.

Particles, e.g., Sn particles, from the source of EUV radiation may fall on the pellicle surface. Removal of such particles is achieved by etching the pellicle surface with an ionized gas, such as $H^+$. The ability of the ionized gas to etch the particles, e.g., Sn particles, from the pellicle surface depends in part on the difference in electronegativity between Sn and the material of the pellicle surface. Accordingly, selection of a material suitable for coating layers 404 and/or 406 takes into consideration the difference in the electronegativity between the particle to be etched, e.g., Sn particle having an electronegativity of 1.96, and the material of the coating layer. Materials having an electronegativity less than the electronegativity of the particle to be etched are preferred as the material for the coating layers compared to materials having an electronegativity greater than the electronegativity of the particle to be etched from the coating layer surface. In accordance with some embodiments, material suitable for coating layers 404 and/or 406 include materials having an electronegativity less than 1.96 down to about −0.2.

Examples of materials useful for coating layers 404 and/or 406 taking into consideration the criteria described above are presented below.

In some embodiments, the coating layer 404 includes boron (B), boron nitride (BN), boron silicon nitride (BNSi), boron carbide ($B_4C$), boron silicon carbide (BCSi), silicon mononitride (SiN), silicon nitride ($Si_3N_4$), silicon dinitride ($SiN_2$), silicon carbide (SiC), silicon carbon nitride ($SiC_xN_y$), niobium (Nb), niobium nitride (NbN), niobium monosilicide (NbSi), niobium silicide ($NbSi_2$), niobium silicon nitride (NbSiN), niobium titanium nitride ($NbTi_xN_y$), zironcium nitride (ZrN), zirconium fluoride ($ZrF_4$), yttrium nitride (YN), yttrium fluoride (YF), molybdenum (Mo), molybdenum nitride ($MoN_2$), molybdenum carbide ($Mo_4C$ and $Mo_2C$), molybdenum silicide ($MoSi_2$), molybdenum silicon nitride ($MoSi_xN_y$), ruthenium-niobium alloys (RuNb), ruthenium silicon nitride (RuSiN), titanium nitride (TiN), titanium carbon nitride ($TiC_xN_y$), hafnium nitride ($HfN_x$), hafnium fluoride ($HfF_4$) or vanadium nitride (VN). Materials for coating layer 404 exclude materials that include higher valence oxides, such as $TiO_2$, $V_2O_5$, $ZrO_2$, $Ta_2O_5$, $MoO_3$, $WO_3$, $CeO_2$, $Er_2O_3$, $SiO_2$, $Y_2O_3$, $Nb_2O_5$, $V_2O_3$, and $HfO_2$.

In some embodiments, materials for coating layer 404 are selected from materials that do not include higher valence oxides, such as boron (B), boron silicon nitride (BNSi), silicon nitride ($Si_3N_4$), silicon dinitride ($SiN_2$), niobium (Nb), niobium nitride (NbN), niobium monosilicide (NbSi), niobium silicide ($NbSi_2$), niobium silicon nitride (NbSiN), niobium titanium nitride ($NbTi_xN_y$), zironcium nitride (ZrN), zirconium fluoride ($ZrF_4$), yttrium nitride (YN), yttrium fluoride (YF), molybdenum (Mo), molybdenum nitride ($MoN_2$), molybdenum silicide ($MoSi_2$), molybdenum silicon nitride ($MoSi_xN_y$), ruthenium-niobium alloys (RuNb), ruthenium silicon nitride (RuSiN), titanium nitride (TiN), titanium carbon nitride ($TiC_xN_y$), hafnium nitride ($HfN_x$), hafnium fluoride ($HfF_4$), or vanadium nitride (VN).

In some embodiments, materials for coating layer 404 are selected from materials that do not include ruthenium or molybdenum, such as boron (B), boron silicon nitride (BNSi), silicon nitride ($Si_3N_4$), silicon dinitride ($SiN_2$), niobium (Nb), niobium nitride (NbN), niobium monosilicide (NbSi), niobium silicide ($NbSi_2$), niobium silicon nitride (NbSiN), niobium titanium nitride ($NbTi_xN_y$), zironcium nitride (ZrN), zirconium fluoride ($ZrF_4$), yttrium nitride (YN), yttrium fluoride (YF), titanium nitride (TiN), titanium carbon nitride ($TiC_xN_y$), hafnium nitride ($HfN_x$), hafnium fluoride ($HfF_4$), or vanadium nitride (VN).

In some embodiments, the coating layer 404 includes boron silicon nitride (BNSi), boron silicon carbide (BCSi), molybdenum carbide ($Mo_4C$), or molybdenum carbide ($Mo_2C$).

The coating layer 404 is thin and does not degrade the transparency of the membrane 306 to UV or EUV light. In some examples, the thickness of the coating layer (404 and 406 as well if it is present) ranges between 1 nm and 10 nm. One example of a coating layer has a thickness of 5 nm with a variation of 10% or less. The coating layer may be formed by a suitable deposition technique, such as chemical vapor deposition (CVD), atomic layer deposition (ALD), plasma enhanced ALD (PEALD), physical vapor deposition (PVD), e-beam deposition, electrodeposition, electroless deposition or other suitable technique.

In accordance with some embodiments of the present disclosure, the coating layer 404 also serves as a thermal conductive layer which promotes the transfer of thermal energy from transparent layer 402 to the environment around the coating layer 404.

In accordance with some embodiments of the present disclosure, the transparent layer 402, (core membrane) is treated prior to application of the coating layer 404 or coating layer 406 to produce minor defects in the surface of transparent layer 402 and/or to remove unwanted silicon dioxide. Producing minor defects in the surface of transparent layer 402 and/or removing unwanted silicon dioxide improves the adhesion of coating layer 404 or coating layer 406 to the surface of transparent layer 402. Examples of suitable processes to treat the surface of transparent layer 402 prior to application of coating layers 404 or 406 include nitrogen, oxygen, carbon fluoride or argon gas plasma treatment. The transparent layer 402 is treated with the gas plasma using a combination of frequency, power, pressure and period of time sufficient to create minor defects in the surface of the transparent layer 402 which will improve adhesion of the coating layer and/or to remove unwanted silicon dioxide.

The mask pellicle system 300 also includes a pellicle frame 304 configured such that the membrane 306 can be attached and secured to the pellicle frame 304. The pellicle frame 304 may be designed in various dimensions, shapes, and configurations. Among those and other alternatives, the pellicle frame 304 may have one single component or multiple components. The pellicle frame 304 includes a material with mechanical strength, and designed in a shape, dimensions, and a configuration so as to secure the membrane 306 properly across the pellicle frame 304. In some embodiments, the pellicle frame 304 may be entirely formed by a porous material.

The pellicle frame 304 includes a porous material designed for ventilation and pressure balance since the pellicle-mask system 300 is in a vacuum environment when secured on the mask stage 106 during the lithography patterning process. As illustrated in FIG. 3C, the porous material of the pellicle frame 304 has connected-pore channels extending from an internal surface 316 to an external surface 318 of the pellicle frame 304 for ventilation. Alternatively as discussed above, pellicle frame 304 includes one or more vents 320 for ventilation and pressure balancing.

In accordance with another embodiment of the present disclosure, a transparent layer comprises a plurality of nanotubes forming a matrix of nanotubes, e.g., carbon nanotubes, boron-nitride nanotubes, silicon carbide nanotubes or combinations thereof. In some embodiments, the transparent layer including the nanotubes is porous. Techniques for forming sheets of a plurality of nanotubes are known. Such sheets of nanotubes when treated in accordance with embodiments of the present disclosure form a combination of a transparent layer and a coating layer that are useful in optical assemblies, e.g., a pellicle membrane, in accordance with embodiments of the present disclosure.

In accordance with embodiments of the present disclosure, the carbon nanotubes are single wall nanotubes or multi-walled nanotubes. In some embodiments, the nanotubes are carbon nanotubes. The nanotubes may be oriented nanotubes or they may be non-oriented nanotubes. The nanotubes may be individual, unbundled nanotubes or the nanotubes may be be bundled individual nanotubes. Carbon nanotubes are susceptible to degradation from exposure to hydrogen gas or oxygen gas, such as the type employed during operation or maintenance of a photolithography system.

Figure 5B:
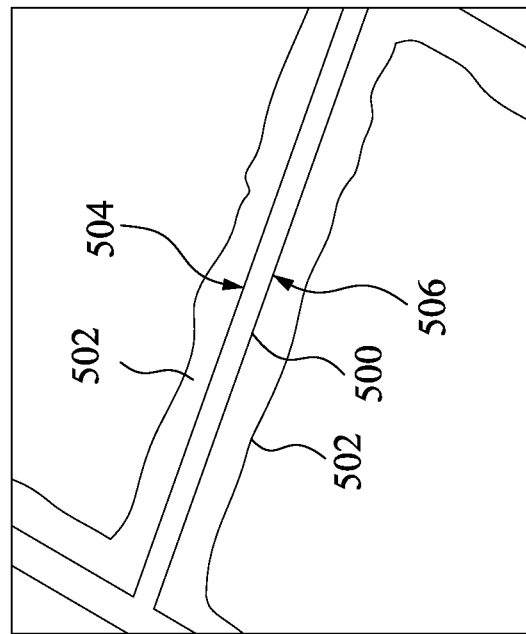
FIG. 5B is an illustration of a covering layer on an external surface and on an internal surface of a nanotube in accordance with embodiments of the present disclosure.
Figure 5A:
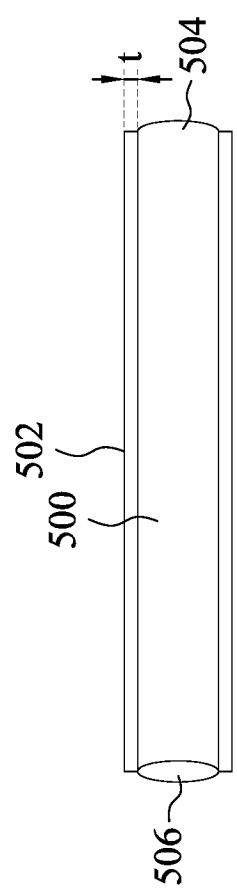
FIG. 5A is a schematic perspective view of a nanotube including a partially removed covering layer in accordance with embodiments of the present disclosure.

Referring to FIG. 5A, an embodiment of the present disclosure includes an unbundled single wall carbon nanotube 500 including a coating layer 502 formed on outer surface 504 from one or more of the materials described above for coating layers 404 and/or 406. As with prior described embodiments, coating layer 502 can comprise a single layer of the same material or can comprise multiple layers of the same material or multiple layers of different materials. Coating layer 502 has a thickness t. In some embodiments, t is 1 to 10 nanometers. FIG. 5B is an illustration of a cross-section of a coated carbon nanotube in accordance with embodiments of the present disclosure. FIG. 5B illustrates how in accordance with some embodiments of the present disclosure, both the external surface 504 of carbon nanotube 500 and the internal surface 506 of carbon nanotube 500 are coated with coating material 502.

In accordance with some embodiments of the present disclosure, the surfaces of carbon nanotube 500 are treated prior to application of the material of coating layer 502 on outside surface 504 and inside surface 506 to modify, i.e., produce minor defects in, the surface of carbon nanotube 500 and/or to introduce functional groups, e.g., hydrophilic groups, to the surfaces of the carbon nanotube. Modifying the surfaces of carbon nanotube 500 improves the adhesion of coating layer 502 on the outer surface 504 or the inner surface 506 of carbon nanotube 500. Examples of suitable processes to treat the surfaces of carbon nanotube 500 prior to application of coating layer 502 include nitrogen, oxygen, carbon fluoride or argon gas plasma treatment. In accordance with some embodiments, the surfaces of the carbon nanotube 500 are treated with the gas plasma using a combination of frequency, power, pressure and period of time sufficient to achieve the desired surface modifications to improve adhesion of coating layer 502 to the nanotube surfaces. In accordance with one embodiment, the carbon nanotube is treated with oxygen plasma at a frequency of about 13.6 MHz at a power of about 100-200 W and a pressure of about 1-200 mTorr. The length of time that the carbon nanotube is so treated is sufficient to provide the desired surface modifications without damaging the carbon nanotubes.

Figure 5C:
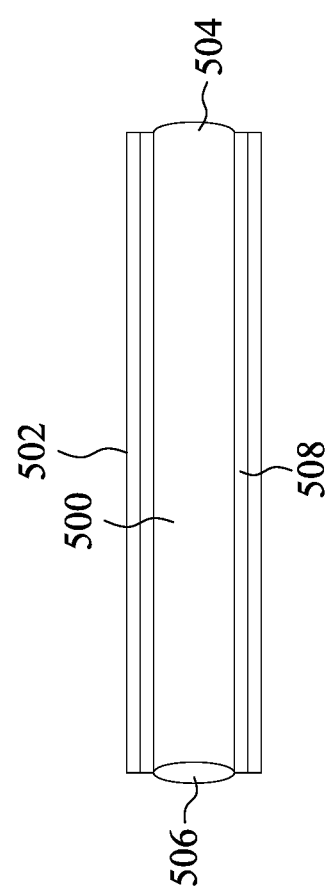
FIG. 5C is a schematic perspective view of a nanotube including a partially removed covering layer and an adhesion layer in accordance with embodiments of the present disclosure.

Referring to FIG. 5C, in other embodiments, the surfaces of the nanotubes 500, e.g., carbon nanotubes, are coated with a layer 508 which promotes adhesion between the surface of the carbon nanotube 500 and the coating layer 502. Such adhesion promoting materials are coated onto surfaces of the carbon nanotubes 500 by deposition processes such as ALD and PEALD. Examples of materials of layer 508 include amorphous carbon or other materials which can be deposited by ALD or PEALD processes and promote adhesion between the surfaces of the carbon nanotubes 500 and the coating layer 502. In accordance with another embodiment of the present disclosure, layer 508 is a protective layer that serves to protect the nanotubes from degradation by a plasma of a PEALD process used to deposit the coating layer 502. When a protective layer is formed on the nanotubes, it is formed by a first deposition process, for example, a thermal atomic layer deposition process in the absence of any plasma. Multiple cycles of the first deposition process can be employed in order to form multiple protective layers on the nanotubes. After one or more protective layers has been formed on the nanotubes, the coating layer 502 can be deposited using a second deposition process, for example, plasma enhanced atomic layer deposition (PEALD) techniques. Due to the presence of the protective layer, the nanotubes of the membrane are not damaged by the plasma of the PEALD process. Examples of materials useful as a protective layer include the same materials described above for forming coating layer 502.

Figure 6B:
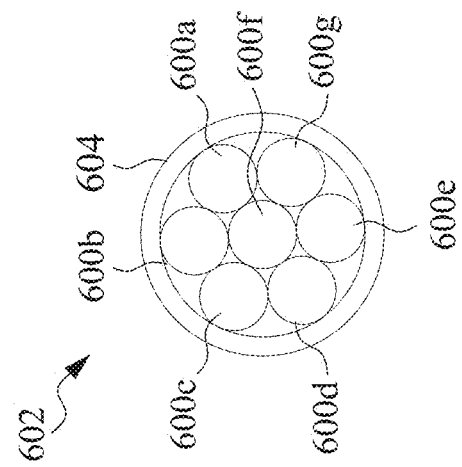
FIG. 6B is a cross-sectional view of a nanotube bundle including a covering layer in accordance with embodiments of the present disclosure.
Figure 6A:
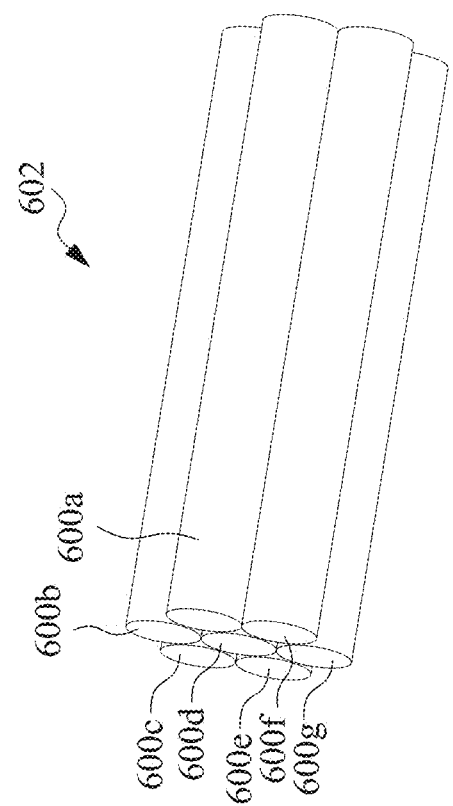
FIG. 6A is a schematic view of a nanotube bundle in accordance with embodiments of the present disclosure.

Referring to FIG. 6A, another embodiment of the utilization of nanotubes in an optical assembly, e.g., a pellicle membrane 306, includes bundling multiple nanotubes. In FIG. 6A, seven nanotubes 600a-600g are bundled to form a nanotube bundle 602. Techniques for bundling nanotubes to form a nanotube bundle 602 useful in embodiments in accordance with the present disclosure are known. In other embodiments, the number of nanotubes making up nanotube bundle 602 is less than seven or is greater than seven. Reducing the number of individual carbon nanotubes forming the nanotube bundle 602 reduces the index of refraction of the nanotube bundle 602. As noted above, reducing the index of refraction has the effect of reducing the scattering of incident EUV radiation, which has the effect of increasing the transmission of incident EUV radiation. Thus, in some embodiments, a nanotube bundle including fewer individual nanotubes would be preferred over a nanotube bundle including a larger number of individual nanotubes.

Referring to FIG. 6B, in accordance with embodiments of the present disclosure, the nanotube bundle 602 is coated with or surrounded by a coating layer 604. The description of materials useful for coating layers 404 and 406 above is applicable to the materials used for coating layer 604. In the embodiment illustrated in FIG. 6B, the coating layer 604 is shown as surrounding the nanotube bundle 602 but is not covering all of the surfaces of the individual nanotubes 600a-600g. In accordance with other embodiments, coating layer 604 coats more of the surfaces of the individual nanotubes 600a-600b than is depicted in FIG. 6B. For example, coating layer 604 can coat the surfaces of nanotubes 600a-600e and 600g that are exposed on the exterior of the nanotube bundle 602. In such embodiment, the outer surface of nanotube 600f is not coated with coating layer 604. In other embodiments, the outer surface of each of the seven nanotubes 600a-600g are coated with the material making up coating layer 604. In other embodiments the transparent layer includes individual nanotubes that have been partially or completely coated with coating layer 604, bundled to form nanotube bundle 602 and then the nanotube bundle is coated/surrounded with an additional layer of coating material 604. In some embodiments, the coating layer 604 covers the entire surface of the nanotube upon which it resides; however, in other embodiments, the coating layer covers less than the entire surface of the nanotube upon which it resides.

In the embodiment of FIGS. 6A and 6B, the individual nanotubes are shown as being closely and tightly packed together. In other embodiments, the individual nanotubes may not be packed as closely and tightly as illustrated in FIGS. 6A and 6B. For example, in other embodiments, portions of the outer surfaces of the nanotubes may not be in contact with each other.

In another embodiment, pellicle membrane 306 includes a plurality of nanotube bundles 602 and a plurality of individual unbundled nanotubes 500. In this embodiment, the plurality of nanotube bundles 602 and the plurality of individual unbundled nanotubes 500 are coated in accordance with the description above.

The description above regarding the selection of a particular material for coating layer 404 applies equally to the selection of a particular material for coating layer 604. The description above regarding the layer 508 as an adhesion layer or a protective layer applies equally to the use of layer 508 in combination with the nanotube bundles of FIGS. 6A and 6B and the coating layer 604.

Nanotube embodiments in accordance with FIGS. 5A, 5B, 6A and 6B provide a pellicle membrane 306 that transmits 85% or more of UV or EUV radiation incident on the transparent layer. In other embodiments, pellicle membrane 306 comprising coated nanotubes or coated nanotube bundles transmits 90% or more of UV or EUV radiation incident on the transparent layer. In some embodiments, pellicle membrane 306 comprising coated nanotubes or coated nanotube bundles transmits 95% or more of UV or EUV radiation incident on the transparent layer.

Figure 7A:
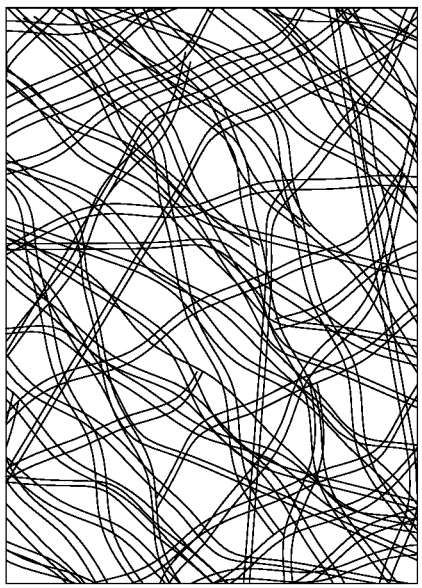
FIGS. 7A-7D are illustrations of uncoated nanotubes, nanotubes after deposition of a coating layer, an exploded view of coated nanotubes and a further exploded view of the carbon nanotubes respectively, in accordance with embodiments of the present disclosure.
Figure 7B:
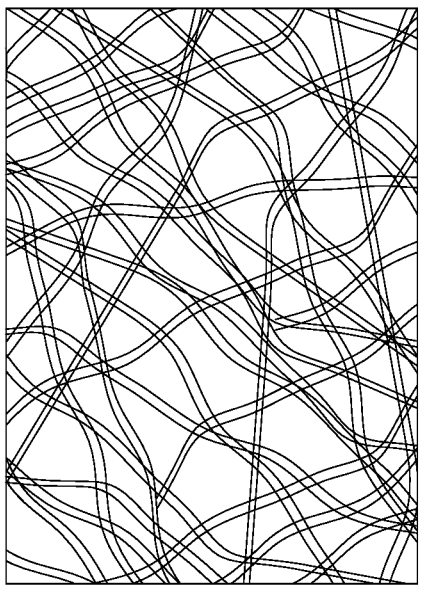
Figure 7C:
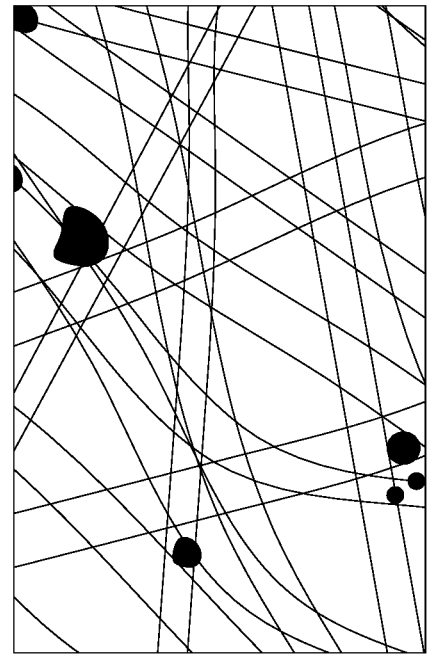
Figure 7D:
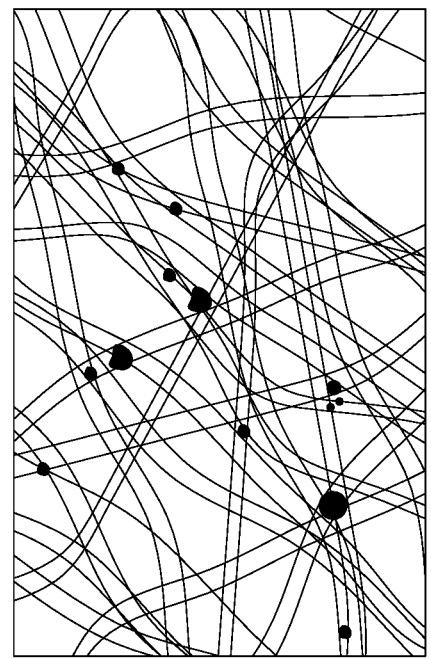

FIG. 7A is an image of a surface of a matrix of nanotubes before deposition of a coating layer. FIG. 7B is an image of the matrix of nanotubes of FIG. 7A after a coating layer has been applied. FIG. 7C is an enlarged view of a portion of FIG. 7B. FIG. 7D is an enlarged view of a portion of FIG. 7B.

Figure 8:
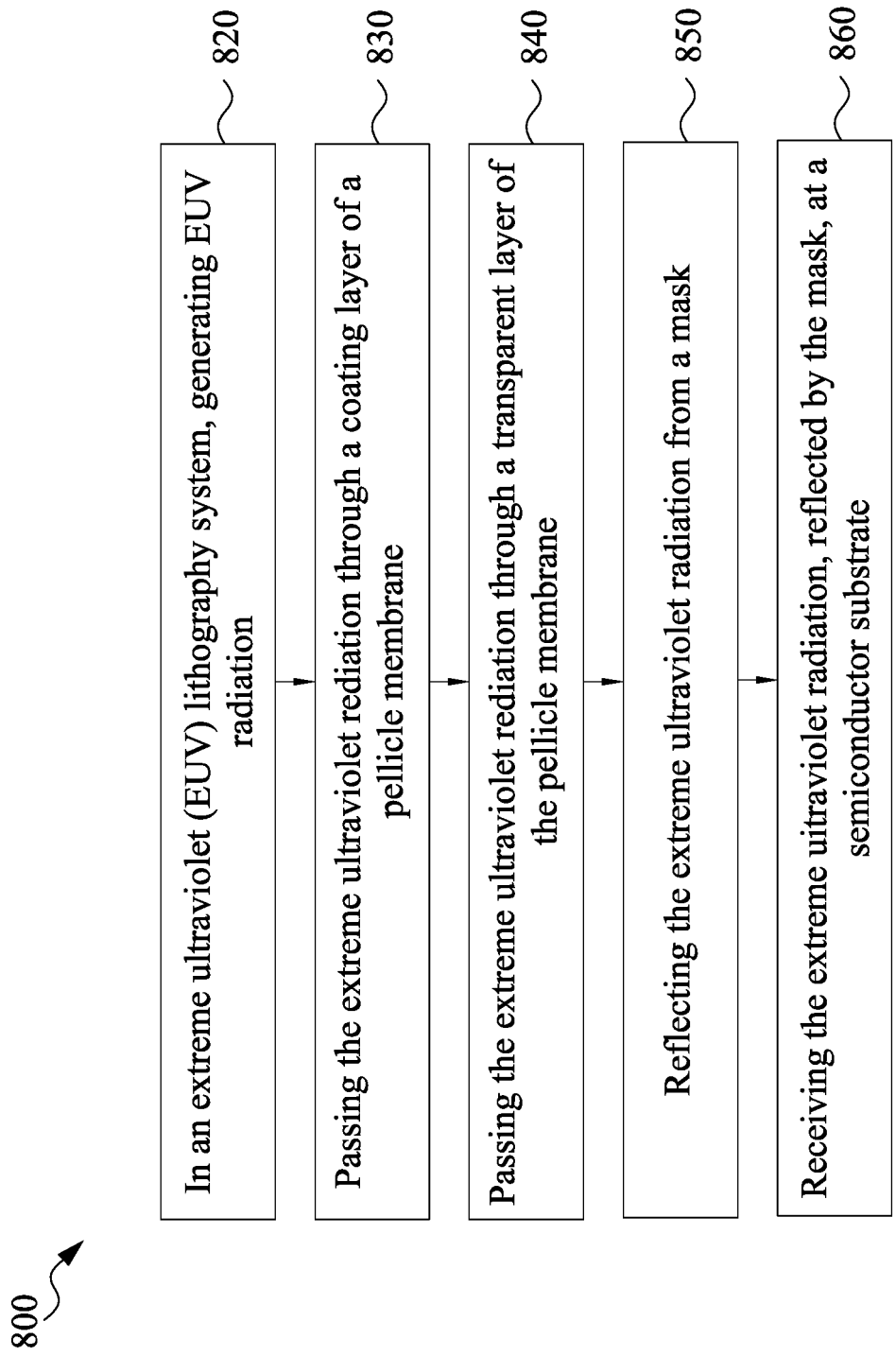
FIG. 8 is a flowchart illustrating a method according to an embodiment of the present disclosure.

Referring to FIG. 8, a method 800 in accordance with embodiments of the present disclosure for patterning a material on a semiconductor substrate in an EUV photolithography system is illustrated and described with reference to FIGS. 1 and 4A-4D. The method includes generating EUV radiation in step 820. EUV radiation can be generated, for example, utilizing the radiation source 102 of FIG. 1 as described above. The generated EUV radiation is passed through a coating layer of a pellicle membrane in step 830. Examples of a coating layer includes coating layers 404, 406, 502 or 604. Passing the generated EUV radiation though the coating layer is accomplished in accordance with the description above for doing the same. An example of a pellicle membrane is pellicle membrane 306. At step 840, the EUV radiation is passed through a transparent layer of the pellicle membrane. Examples of a transparent layer of the pellicle membrane include the transparent layer 402 described above with reference to FIGS. 4A-4C. Passing EUV radiation through a transparent layer of a pellicle membrane can be carried out in accordance with the description above. EUV radiation that is passed through the transparent layer of the pellicle membrane is reflected from a mask at step 850. An example of a mask suitable for reflecting the EUV radiation is mask 108 described above. Mask 108 reflects EUV radiation as described above. At step 860, EUV radiation is received at a semiconductor substrate. An example of a semiconductor substrate is semiconductor substrate 116 described above.

Figure 9:
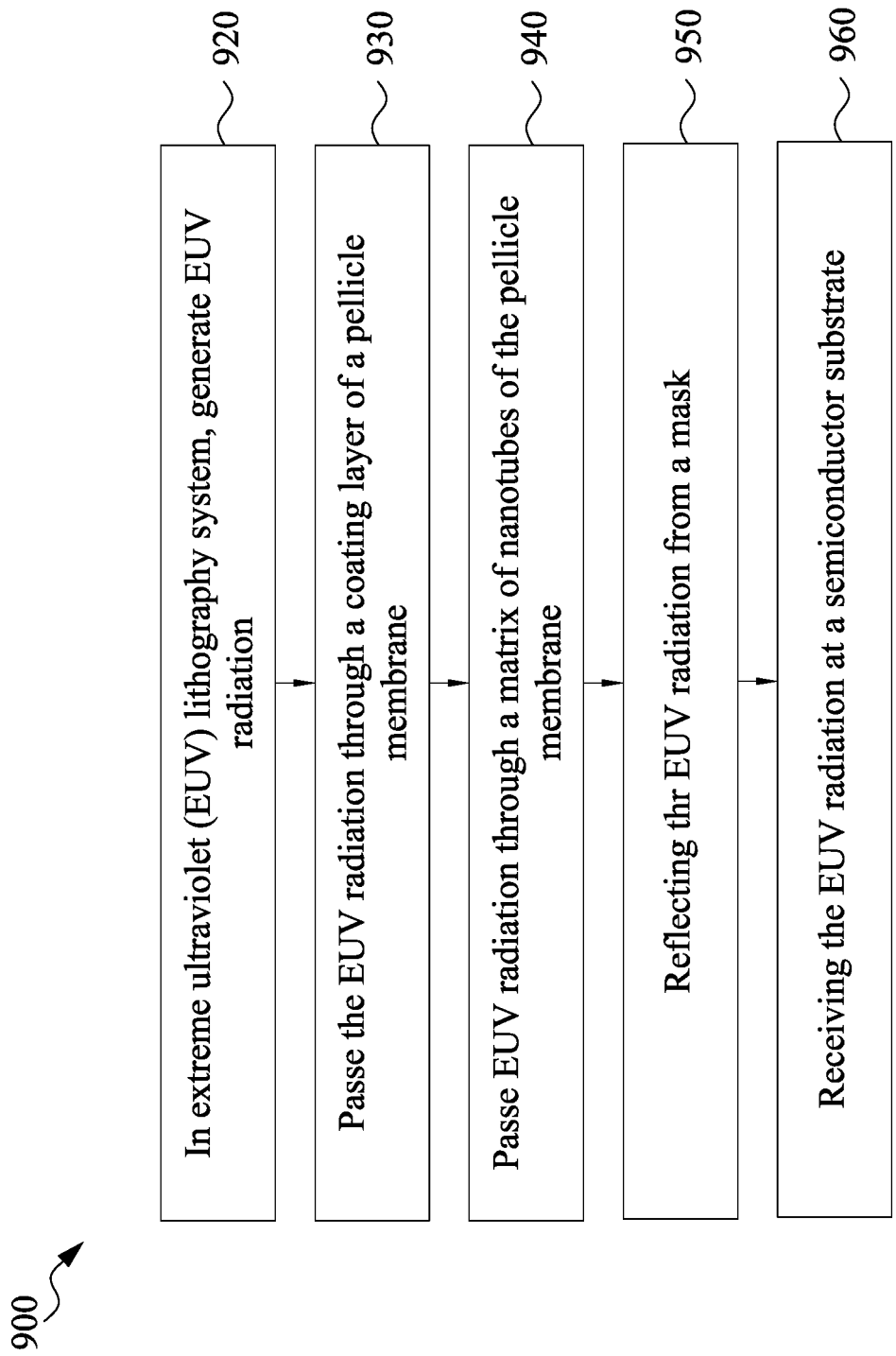
FIG. 9 is a flowchart illustrating a method according to an embodiment of the present disclosure.

Referring to FIG. 9, a method 900 in accordance with embodiments of the present disclosure for patterning a material on a semiconductor substrate in an EUV photolithography system is illustrated and described below with reference to FIGS. 1 and 4A-4D. The method includes generating EUV radiation in step 920. EUV radiation can be generated, for example, utilizing the radiation source 102 of FIG. 1 as described above. The generated EUV radiation is passed through a coating layer of a pellicle membrane in step 930. Examples of a coating layer include coating layers 404, 406, 502 or 604. Passing the generated EUV radiation though the coating layer is accomplished in accordance with the description above for doing the same. An example of a pellicle membrane is pellicle membrane 306. At step 940, the EUV radiation is passed through matrix of nanotubes of the pellicle membrane. Examples of nanotubes of the pellicle membrane include the nanotubes and nanotube bundles described above with reference to FIGS. 5A, 5B, 6A and 6B. Passing EUV radiation through a matrix of nanotubes of a pellicle membrane can be carried out in accordance with the description above. EUV radiation that is passed through the matrix of nanotubes of the pellicle membrane is reflected from a mask at step 950. An example of a mask suitable for reflecting the EUV radiation is mask 108 described above. Mask 108 reflects EUV radiation as described above. At step 960, EUV radiation is received at a semiconductor substrate. An example of a semiconductor substrate is semiconductor substrate 116 described above.

Figure 10:
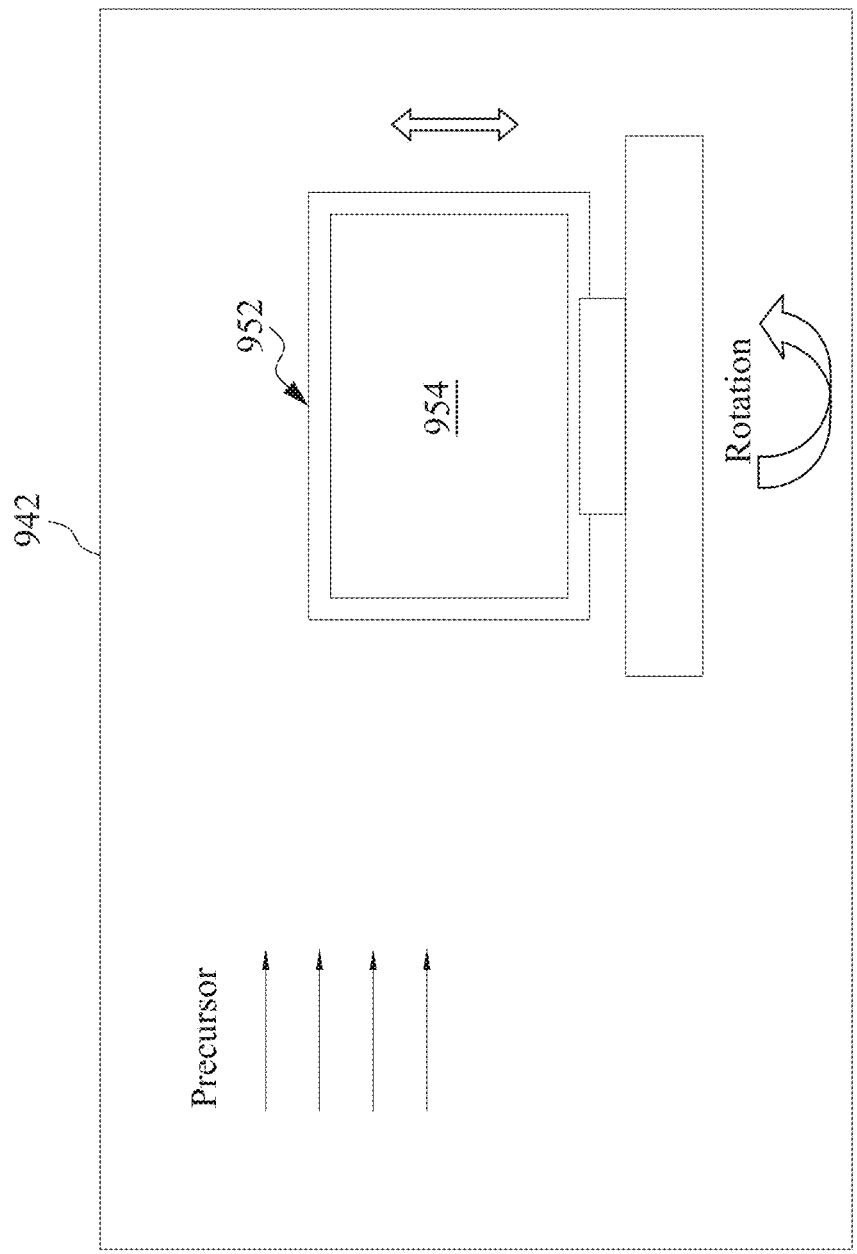
FIG. 10 is a schematic illustration of a system for applying a protective layer or a coating layer to a nanotube in accordance an embodiment of the present disclosure.
Figure 11:
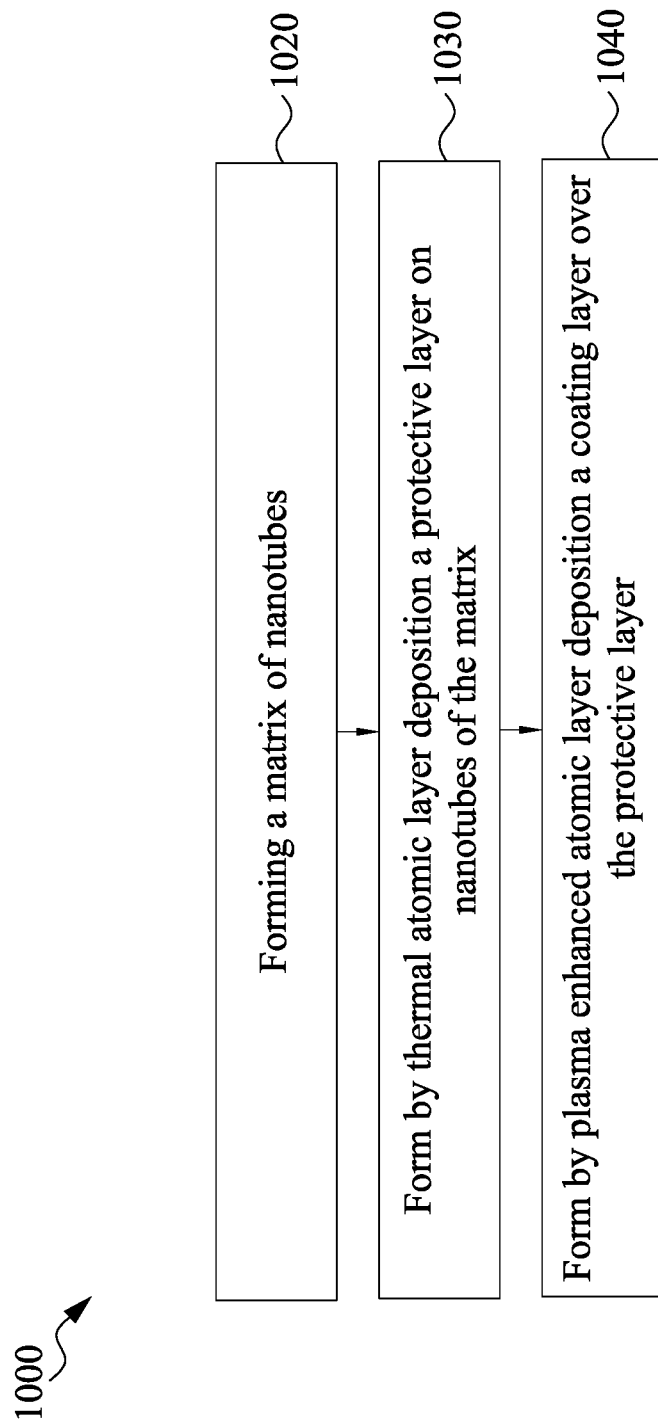
FIG. 11 is a flowchart illustrating a method according to an embodiment of the present disclosure.

FIG. 11 is a flowchart illustrating a method in accordance with the present disclosure for forming a protective, adhesion or coating layers on transparent layer 402 or a matrix of nanotubes formed into a membrane 954 at step 1020. In method 1000 of FIG. 11, the transparent layer 402 or the matrix of nanotubes provided as a membrane 954, e.g., on a frame or border 952 is supported, e.g., vertically, in a chamber 942 capable of carrying out a thermal ALD or CVD process and a plasma-enhanced ALD or CVD process. The transparent layer 402 or the frame 952 is supported within chamber 942 such that they have multiple freedoms of movement. For example, in the embodiment illustrated in FIG. 10, frame 952 can be rotated around a vertical axis or it can be tilted around the horizontal axis. Embodiments in accordance with the present disclosure are not limited to rotating the frame around the vertical access or tilting it around the horizontal axis. In other embodiments, the frame has freedom of movement in addition to rotation around a vertical axis or tilting around the horizontal axis. Such rotation and tilting can be implemented during a thermal process and/or a plasma-enhanced process to promote even coating of nanotubes of the membrane 954 with a coating layer, adhesion layer or protective layer. Conditions within the chamber are maintained to promote uniform deposition of the coating layer, adhesion layer or protective layer, e.g., temperatures in the range of 500 degrees Celsius to 1200 degrees Celsius. Such temperatures are provided by providing thermal energy from the chamber walls or heaters associated with the chamber walls. Embodiments in accordance with the present disclosure for forming protective, adhesion or coating layers on a matrix of nanotubes or transparent layer 402 are not limited to utilizing thermal PVD or CVD and plasma enhanced PVD or CVD. For example, such layers can be formed using ion beam deposition techniques. The description above regarding utilizing thermal PVD or CVD and plasma enhanced PVD or CVD also applies to the use of ion beam deposition. At step 1030, a protective layer is formed on the transparent layer or nanotubes of the membrane by a thermal atomic layer deposition process. At step 1040, a coating layer is formed over the protective layer by a plasma enhanced atomic layer deposition (PEALD). The chamber 942 illustrated in FIG. 10 is an example of a chamber where both thermal atomic layer deposition and plasma enhanced atomic layer deposition can be carried out. Method 1000 is not limited to utilizing a single chamber in which both thermal and plasma enhanced atomic layer deposition is carried out. For example, in other embodiments, the thermal deposition process can be carried out in one chamber and the plasma enhanced deposition can be carried out in another different chamber.

In one embodiment, the present disclosure describes an optical assembly, e.g., a pellicle assembly, including a matrix of a plurality of nanotube bundles. In such embodiment, a coating layer is provided on the matrix of a plurality of nanotube bundles. Coating layer surrounds individual nanotubes of individual nanotube bundles.

According to a second aspect of embodiments disclosed herein, there is provided a method that includes generating EUV radiation in an EUV lithography system. The EUV radiation has passed through a coating layer of a pellicle membrane. The EUV radiation that is passed through the coating layer of the pellicle membrane is passed through a transparent layer of the pellicle membrane. The EUV radiation that has passed through the transparent layer of the pellicle membrane is reflected from a mask and received at a semiconductor substrate.

According to a third aspect of embodiments disclosed herein, there is provided a method that includes generating EUV radiation in an EUV lithography system. The EUV radiation is passed through a coating layer of a pellicle membrane. The EUV radiation that has passed through the coating layer of the pellicle membrane is passed through a matrix of nanotubes of the pellicle membrane. The EUV radiation that has passed through the matrix of nanotubes of the pellicle membrane is reflected from a mask and received at a semiconductor substrate.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
generating EUV radiation in an extreme ultraviolet (EUV) lithography system;
passing the extreme ultraviolet radiation through a coating layer of a pellicle membrane, the coating layer comprising a material selected from the group consisting of one or more of niobium monosilicide (NbSi), niobium silicide ($NbSi_2$), niobium silicon nitride (NbSiN), niobium titanium nitride ($NbTi_xN_y$), molybdenum silicon nitride (MoSi$_x$N$_y$), yttrium fluoride (YF), titanium carbon nitride (TiC$_x$N$_y$), and hafnium fluoride (HfF$_4$);

passing the extreme ultraviolet radiation that has passed through the coating layer through a transparent layer of the pellicle membrane, wherein the transparent layer of the pellicle membrane includes a matrix of a plurality of nanotube bundles, the plurality of nanotube bundles including nanotube bundles including nanotubes consisting of carbon atoms, nanotube bundles including nanotubes of carbon atoms and nitrogen atoms and nanotube bundles including nanotubes of carbon atoms and silicon atoms;

reflecting the extreme ultraviolet radiation that has passed through the transparent layer from a mask; and receiving the extreme ultraviolet radiation, reflected by the mask, at a semiconductor substrate.

2. The method of claim 1, wherein the passing the extreme ultraviolet radiation through a coating layer of a pellicle membrane includes passing the extreme ultraviolet radiation through a coating layer including one or more of niobium monosilicide (NbSi), niobium silicide (NbSi$_2$), niobium silicon nitride (NbSiN), niobium titanium nitride (NbTi$_x$N$_y$), yttrium fluoride (YF), and hafnium fluoride (HfF$_4$).

3. The method of claim 1, wherein the passing the extreme ultraviolet radiation through a coating layer of a pellicle membrane includes passing the extreme ultraviolet radiation through a matrix of bundled nanotubes and a coating layer on the bundled nanotubes.

4. The method of claim 3, wherein the passing the extreme ultraviolet radiation through a matrix of bundled nanotubes and a coating layer on the bundled nanotubes further includes passing the extreme ultraviolet radiation through a matrix of bundled nanotubes and a coating layer on the bundled nanotubes, wherein the coating on the bundled nanotubes includes a coating on individual nanotubes of the bundled nanotubes.

5. The method of claim 1, wherein the nanotube bundles include seven or more individual nanotubes.

6. The method of claim 1, wherein the plurality of nanotube bundles include carbon nanotubes.

7. A method, comprising:
generating EUV radiation in an extreme ultraviolet (EUV) lithography system;
passing the extreme ultraviolet radiation through a coating layer of a pellicle membrane, the coating layer comprising a material selected from the group consisting of one or more of niobium monosilicide (NbSi), niobium silicide (NbSi$_2$), niobium silicon nitride (NbSiN), niobium titanium nitride (NbTi$_x$N$_y$), molybdenum silicon nitride (MoSi$_x$N$_y$), yttrium fluoride (YF), titanium carbon nitride (TiC$_x$N$_y$), and hafnium fluoride (HfF$_4$);
passing the extreme ultraviolet radiation that has passed through the coating layer through a transparent layer of the pellicle membrane;
reflecting the extreme ultraviolet radiation that has passed through the transparent layer from a mask; and
receiving the extreme ultraviolet radiation, reflected by the mask, at a semiconductor substrate.

8. The method of claim 7, wherein the transparent layer of the pellicle membrane includes polycrystalline silicon (poly-Si), amorphous silicon (a-Si), doped silicon or a doped silicon-based compound, carbon nanotube, silicon carbon nanotube or boron nitride nanotube.

9. The method of claim 7, wherein the transparent layer of the pellicle membrane includes polycrystalline silicon (poly-Si), silicon nitride (Si$_x$N$_y$), silicon carbide (SiC) or molybdenum silicon nitride (MoSi$_x$N$_y$).

10. The method of claim 9, wherein the coating layer includes one or more of niobium monosilicide (NbSi), niobium silicide (NbSi$_2$), niobium silicon nitride (NbSiN), niobium titanium nitride (NbTi$_x$N$_y$), yttrium fluoride (YF), and hafnium fluoride (HfF$_4$).

11. The method of claim 7, further comprising passing the extreme ultraviolet radiation that has passed through the transparent layer of the pellicle membrane into a second coating layer of the pellicle membrane.

12. The method of claim 7, wherein passing the extreme ultraviolet radiation through a coating layer of a pellicle membrane includes passing the extreme ultraviolet radiation through a first coating layer and then passing the extreme ultraviolet radiation that has passed through the first coating layer through a second coating layer before passing the extreme ultraviolet radiation through the transparent layer.

13. A method comprising:
forming a matrix of nanotubes;
forming, by a first process, a protective layer on the nanotubes of the matrix of nanotubes; and
forming, by a second process a coating layer over the protective layer,
wherein the protective layer and the coating layer independently comprise a material selected from the group consisting of one or more of niobium monosilicide (NbSi), niobium silicide (NbSi$_2$), niobium silicon nitride (NbSiN), niobium titanium nitride (NbTi$_x$N$_y$), molybdenum silicon nitride (MoSi$_x$N$_y$), yttrium fluoride (YF), titanium carbon nitride (TiC$_x$N$_y$), and hafnium fluoride (HfF$_4$).

14. The method of claim 13, wherein the nanotubes of the matrix of nanotubes includes a plurality of individual unbundled nanotubes.

15. The method of claim 13, wherein the nanotubes of the matrix of nanotubes includes a plurality of bundled nanotubes.

16. The method of claim 15, wherein the bundled nanotubes include seven or more individual nanotubes.

17. The method of claim 13, wherein the nanotubes are carbon nanotubes.

18. The method of claim 13, wherein the forming, by the first process includes forming two or more protective layers using two or more cycles of thermal atomic layer deposition.

19. The method of claim 1, wherein the coating layer comprises yttrium fluoride (YF).

20. The method of claim 1, wherein the coating layer comprises hafnium fluoride (HfF$_4$).

* * * * *